United States Patent [19]

Eberlein et al.

[11] Patent Number: 5,332,463
[45] Date of Patent: Jul. 26, 1994

[54] SELF-ALIGNED SEALING FIXTURE FOR USE IN ASSEMBLY OF MICROELECTRONIC PACKAGES

[75] Inventors: Delvin D. Eberlein, Altoona; Peter J. Wehner, Eau Claire, both of Wis.

[73] Assignee: Cray Research, Inc., Eagan, Minn.

[21] Appl. No.: 128,050

[22] Filed: Sep. 28, 1993

Related U.S. Application Data

[63] Continuation of Ser. No. 821,005, Jan. 15, 1992, abandoned.

[51] Int. Cl.$^5$ .................. B32B 31/00; H05K 3/30
[52] U.S. Cl. .................. 156/556; 156/299; 156/538; 29/740; 29/759; 269/903
[58] Field of Search ............ 156/299, 538, 556, 566; 29/740, 759, 834; 269/289 R, 900, 903

[56] References Cited

U.S. PATENT DOCUMENTS

| | | | |
|---|---|---|---|
| 1,496,182 | 6/1924 | Stark | 156/299 X |
| 4,250,615 | 2/1981 | Knuth et al. | 29/834 X |
| 4,545,761 | 10/1985 | Cartwright et al. | 228/212 X |
| 4,809,839 | 3/1989 | Elliott | 29/740 X |
| 4,868,974 | 9/1989 | Nishiguchi | 29/740 |

Primary Examiner—David A. Simmons
Assistant Examiner—James J. Engel, Jr.
Attorney, Agent, or Firm—Daniel J. Kluth

[57] ABSTRACT

An alignment fixture for use in sealing integrated circuit packages including a body having rectangular alignment cavities therein for receiving components of integrated circuit packages. The body is inclined at an angle relative to a horizontal reference plane. The rectangular alignment cavities are rotated at 45½ angle relative to a longitudinal axis of the body.

8 Claims, 5 Drawing Sheets

SELF-ALIGNED SEALING FIXTURE FOR USE IN ASSEMBLY OF MICROELECTRONIC PACKAGES

This is a continuation of application Ser. No. 07/821,005, filed Jan. 15, 1992 now abandoned.

FIELD OF THE INVENTION

This invention relates generally to the packaging of high density integrated circuits (ICs). More particularly, this invention relates to a sealing fixture for use in hermetically sealing integrated circuit packages.

BACKGROUND OF THE INVENTION

Packaging is considered by many in the industry to be the pacing technology for integrated circuit development. As integrated circuit board density continues to increase, integrated circuit package dimensions and tolerances become more critical.

Integrated circuit packages are usually sealed from the environment by joining and aligning a package base or chip carrier to a package lid via a sealing material and a sealing fixture. During this critical joining and alignment operation between the chip carrier and package lid, the final package dimensions are determined.

The sealing process is accomplished by placing the chip carrier and package lid into the sealing fixture and then usually placing the combination into an oven to cure the sealing material. The most common sealing materials used include glasses, solders and epoxy. The sealing fixture's primary function is to align all package components to within the required specifications.

Prior art designs of sealing fixtures include fixtures having openings or windows into which the chip carriers and lids are placed. The fixtures are then horizontally placed into an oven and rely on gravity to provide intimate contact between the chip carrier, sealing material and lid. Alignment accuracy in such processes is dependent upon the worst case tolerances of the IC package as well as those of the fixture.

Other prior art designs include sealing fixtures which are made up of two or more parts. The first part, often called a process boat, is used in packaging assembly steps prior to sealing, i.e. wire bond and die attach. The second part often called an alignment cover is fitted onto the process boat just before sealing and aligns the lid to the chip carrier. In this design, alignment accuracy is also dependant on the worst case tolerances of the alignment cover.

Another common sealing fixture is a simple clip or an arrangement of clips which holds the IC package components together under slight pressure during the sealing process.

As the demands for integrated circuit package dimensions and tolerances continue to increase with increasing circuit board densities, many prior art sealing fixtures can no longer produce sealed IC packages which meet those demands. This results in the need for a sealing fixture capable of producing finished sealed packages with greater alignment accuracy. In addition, such a fixture should lend itself to automated high volume production.

SUMMARY OF THE INVENTION

To overcome limitations in the art described above and to overcome limitations that will become apparent upon reading and understanding the present specification, the present invention describes a self-aligning sealing fixture. The sealing fixture is capable of providing improved alignment accuracy of IC components during the sealing process creating an integrated circuit package having desired dimensions and tolerances.

According to the present invention, the self-aligned sealing fixture for use in sealing integrated circuit packages includes a body having at least one alignment cavity located therein for receiving components of the integrated circuit package. The body is inclined at an angle relative to a horizontal reference plane.

In one embodiment of the invention, the alignment cavity is a rectangular cavity rotated at 45° angle relative to the lengthwise axis of the body.

A method for sealing an integrated circuit package is further disclosed. A chip carrier having an IC mounted therein, a package lid, and adhesive means for sealing said chip carrier and said package lid is provided. Also provided is an inclined sealing fixture. The inclined sealing fixture has a body with a length-wise axis. At least one alignment cavity is located within the body and is rotated at a 45° angle relative to the length-wise axis of the body. The body is inclined relative to a horizontal reference plane. Adhesive is placed on the package lid or the chip carrier. The package lid is positioned in said alignment cavity and the chip carrier is positioned in the alignment cavity adjacent to the package lid such that the adhesive exists between the lid and chip carrier. The inclined sealing fixture is heated with the chip carrier, the package lid, and the adhesive thereon to seal the IC package.

An alternative method for sealing an integrated circuit package is also disclosed. A chip carrier is placed within a rectangular chamber on a base of a first body portion. The rectangular chamber is rotated at a 45° angle relative to a lengthwise axis of the first body portion. The chamber is defined by walls extending from the base. A second body portion, having slots for mating with the walls of the first body portion, is positioned upon the walls of the first body portion. The second body portion has a window therethrough. A lid is partially inserted through the window and positioned upon the chip carrier. A sealing material is placed between the lid and the chip carrier. The mated first and second body portion are inclined relative to a horizontal plane, and the inclined first and second body portions along with the chip carrier, lid and sealing material are heated to seal the integrated circuit package.

For a better understanding of the invention, as well as other objects and further features thereof, reference is had to the following detailed description of the preferred embodiment taken in conjunction with accompanying drawings.

DETAILED DESCRIPTION OF THE INVENTION

Figure 1:
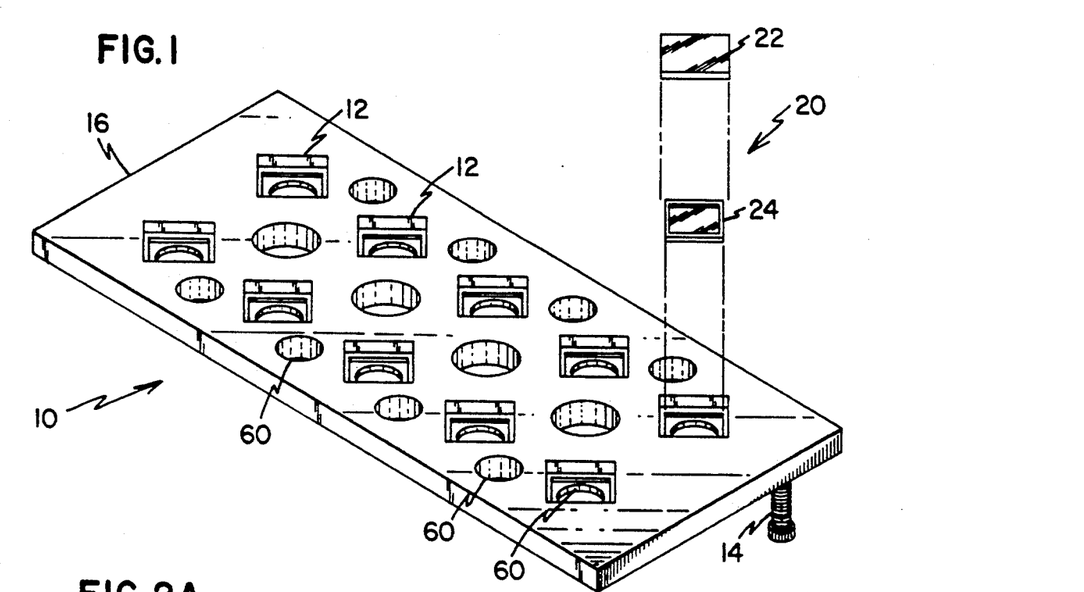
FIG. 1 is an exploded perspective view of the self-aligned sealing fixture of the present invention with IC package components thereon.

Referring now to the drawings, the preferred embodiment of a self-aligning sealing fixture for use in sealing a chip carrier and lid shall be described. FIG. 1 shows an exploded perspective view of a self-aligning sealing fixture 10 having rectangular or square alignment cavities 12 therein. The alignment cavities 12 align the IC package components 20, such that, when the IC package is sealed, all final desired dimensional specifications of the package are met. The cavities are sized to allow for the worst case tolerance IC components. The IC package components 20, also rectangular or square in shape, include chip carrier 22 and lid 24. The self-aligning sealing fixture 10 includes a body 16 having a lengthwise axis therein and inclining means 14 for inclining the body 16 at an angle $\theta$ relative to a horizontal reference plane 34, FIG. 4.

The IC package components 20 are placed, lid 24 first, into the alignment cavity 12 of the self-aligning sealing fixture 10 prior to a high temperature sealing step. Gravity will cause the components to automatically align themselves along the walls 50 and 42, FIGS. 3 and 4, of the downhill portion of the alignment cavity 12 and keep them along these walls throughout the sealing process.

Figure 5A:
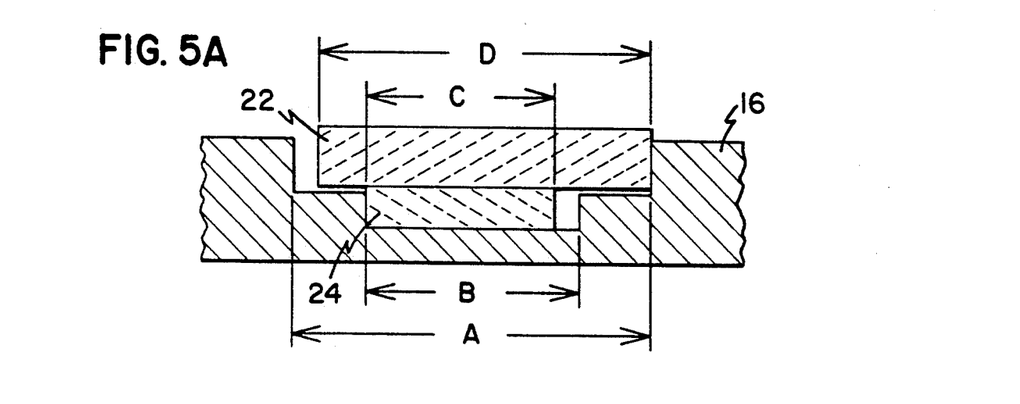
FIGS. 5A and 5B are schematic representations for comparing package alignment errors for a horizontal sealing fixture and an inclined fixture.
Figure 5B:
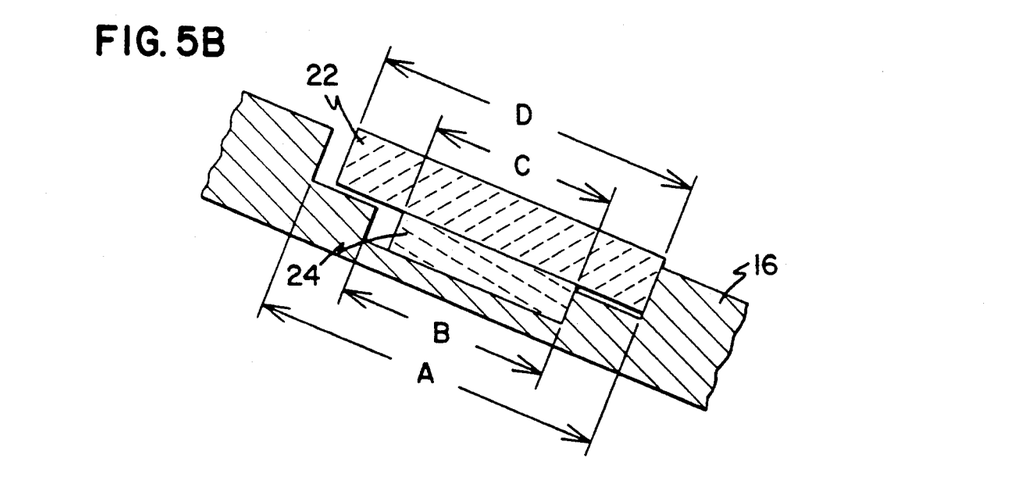

With reference to FIGS. 5A and 5B, mathematical analysis shows that by use of the self-aligning sealing fixture in an inclining position, FIG. 5B, the final alignment error between chip carrier 22 and lid 24 in the X,Y plane of the package, can be reduced by a factor of approximately five over that of a package sealed in an identical horizontal positioned fixture, FIG. 5A. Alignment error can be calculated by the difference between an actual possible error and an ideal situation. The alignment error of the fixture in FIG. 5A, which shows the fixture in a horizontal position, is equal to $[\frac{1}{2}(A+B-C-D)]$ or [actual−ideal], wherein actual=−$\frac{1}{2}(A-B)+(B-C)$ and ideal=$\frac{1}{2}(D-C)$. The alignment error of the inclined fixture in FIG. 5B, is equal to $[\frac{1}{2}(A-B+C-D)]$ or [actual−ideal], wherein actual=−$\frac{1}{2}(A-B)$ and ideal=$\frac{1}{2}(D-C)$. Thus, for a fixture and package having the dimensions of A=0.620, B=0.565, C=0.555 and D=0.605, error for the horizontal positioned fixture is approximately five times the error for the inclined fixture. Similarly, lid rotation or twist (theta error) relative to the chip carrier is virtually eliminated.

The reduction in alignment error is further explained in that all alignment cavities in any sealing fixtures must be oversized in order to accommodate the size variations that occur in package components 20. This cavity oversize results in lid offset and/or twist errors in the finished package because the package components are free to shift to either side within the oversized cavity, as shown in FIG. 5A. However, by inclining the fixture, as shown in FIG. 5B, at an angle and orientating the part such that one of the corners of the package points downhill, the fixture becomes self-aligning and the lid offset and/or twist error is reduced.

In the preferred embodiment, the body 16 of self-aligning sealing fixture 10 is rectangular in shape having a lengthwise axis. The material used for the body of the fixture can be aluminum, steel, stainless steel or any other material suitable for the process. The material must have the ability to withstand repeated exposure to the sealing environment, for example, high temperatures. The material must also be dimensionally stable at or above the sealing temperature. The more dimensionally stable the fixture material is during the high temperature operation, the less additional error will be introduced as a result of expansion of the sealing fixture.

Figure 2A:
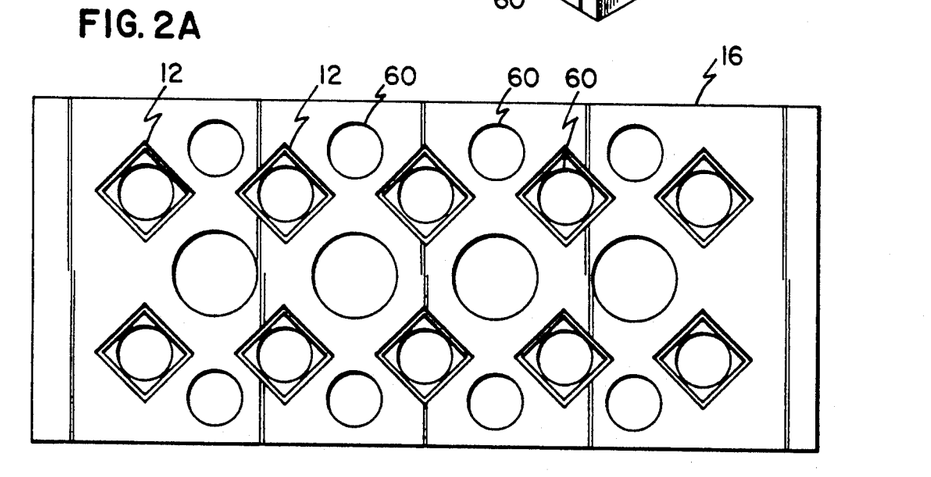
FIGS. 2A and 2B are a top view and front view, respectively, of the self-aligned sealing fixture of FIG. 1.
Figure 2B:
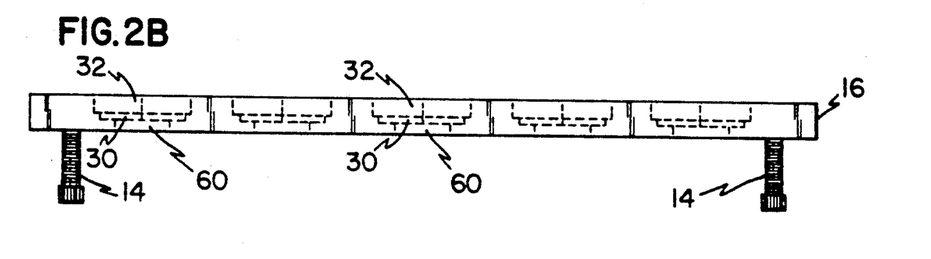
Figure 3:
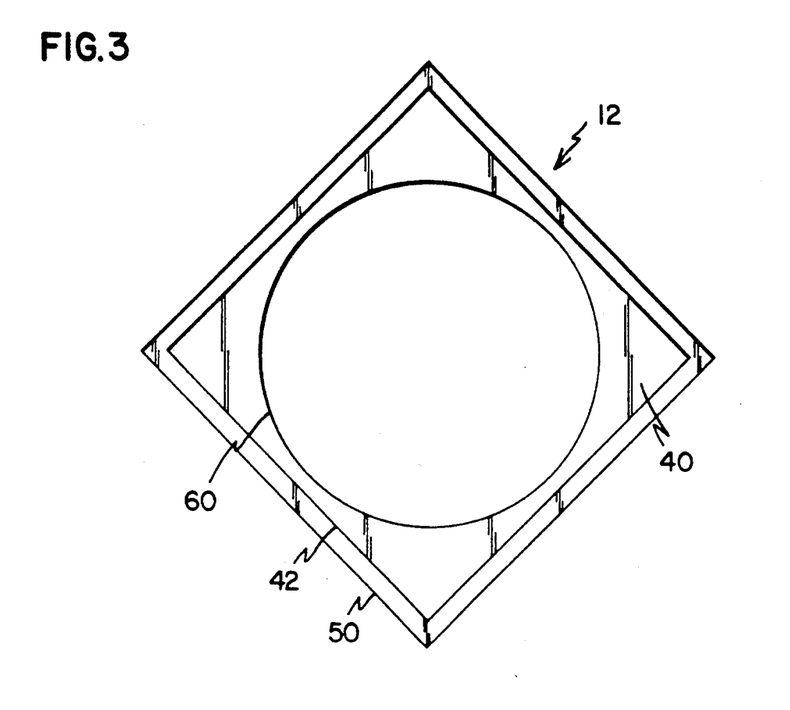
FIG. 3 shows a top view of an alignment cavity of the sealing fixture of the present invention.
Figure 4:
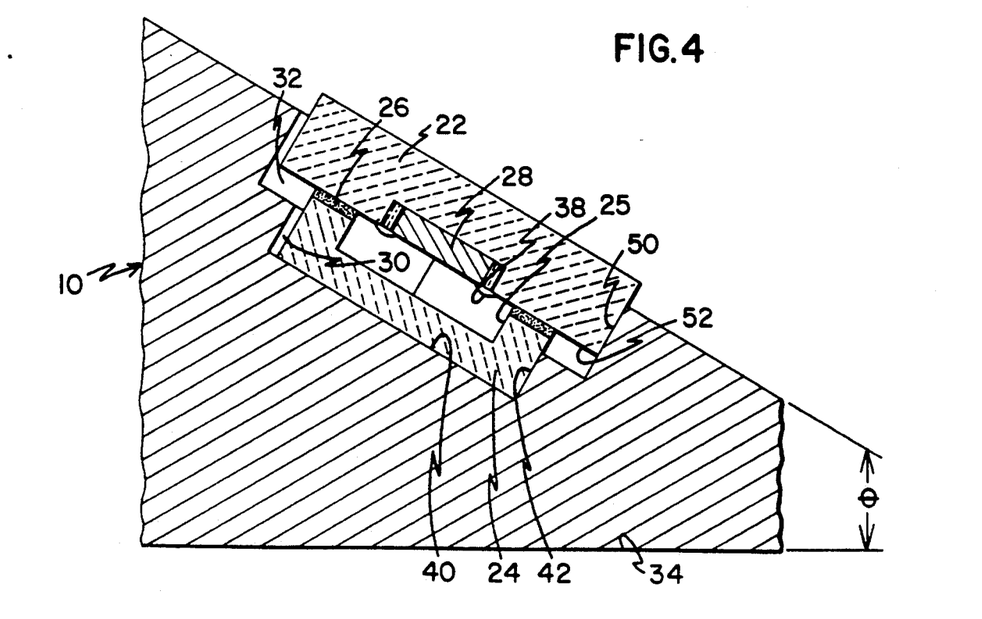
FIG. 4 illustrates a cross-sectional view of an alignment cavity of the sealing fixture of the present invention having the IC package components positioned thereon.

The alignment cavity 12 as shown in FIGS. 1-3 is either square or rectangular in shape and is rotated at 45° relative to the lengthwise axis of the sealing fixture body 16. As shown in FIG. 2B and FIG. 4, the alignment cavity 12 includes two chambers 30 and 32. The first chamber 30 has a base 40 for receiving the package lid 24 thereon. The first chamber 30 further includes walls 42 for aligning the lid 24 within the alignment cavity 12. The second chamber 32 has walls 50 extending from walls 42 of the first chamber 30 to form the opening in the alignment cavity 12. The walls 50 align the chip carrier 22 when positioned within the alignment cavity 12.

The sealing fixture body 16 and alignment cavities therein are produced by stamping, milling or other precision machining processes. The fixture being a single piece has the advantage of reduced alignment error introduced by multi-piece fixtures. Multi-piece fixtures, when assembled, add additional tolerance errors to the finished sealed IC package.

The assembly of the IC package components 20 during the sealing process can best be described by reference to FIG. 4. As is known in the art, an IC 28 is mounted in a cavity of chip carrier 22. The IC 28 is electrically connected to chip carrier 22 by means of a wirebond or TAB connection 38, also commonly known in the art. The carrier lid 24 is positioned in the first chamber 30 with extended portions 25 extending upward into chamber 32 of alignment cavity 12. A sealing material 26 is placed between the lid 24 and chip carrier 22. The chip carrier 22 is placed into second chamber 32 such that IC 28 is located between the chip carrier 22 and lid 24. The assembly is then usually placed into an oven to accomplish sealing thereof.

A connection area 52 between the edge of the lid and the edge of the chip carrier is required to facilitate electrical bonding between the finished sealed IC package and the outside world, such as a circuit board. This critical connection area 52 must be maximized for high lead count devices. Thus, lid offset and/or twist must be minimized.

When the self-aligning sealing fixture is inclined at angle $\theta$, the rectangular or square lid 24 and chip carrier 22 align themselves along a downhill edge of the alignment cavity 12. These downhill edges control the lid 24 position (X, Y plane and theta rotation) relative to the chip carrier 22. The preferred inclination angle $\theta$ is approximately 20°. However, the angle $\theta$ may typically range between 10° and 30° and still accomplish alignment along the downhill walls of the alignment cavity 12. The 45° rotation of the cavity 12 relative to the longitudinal axis of the sealing fixture body 16 provides alignment of all four sides of a rectangular component.

During a dynamic sealing process in which the self-aligning sealing fixture 10 having the aligned IC package components 20 thereon is in motion, such as in a belt driven furnace, the components will continue to maintain alignment because of gravity and the incline angle of the sealing fixture 10. Also, because only the downhill edges of the fixture are responsible for alignment, the errors resulting from the expansion of the fixture itself during the high temperature sealing process will be decreased in comparison to a similar fixture laying horizontal.

With respect to another aspect of the preferred embodiment of the present invention, the sealing fixture body 16 has several large circular holes 60 therein. The function of the holes 60 is to remove some of the mass of the fixture body 16. As the sealing fixture 10 is placed in a sealing oven, the temperature response of the chip carrier 22 and lid 24 are dependent upon the sealing fixture mass. As one skilled in the art will recognize, the location and size of the holes is arbitrary.

Figure 6:
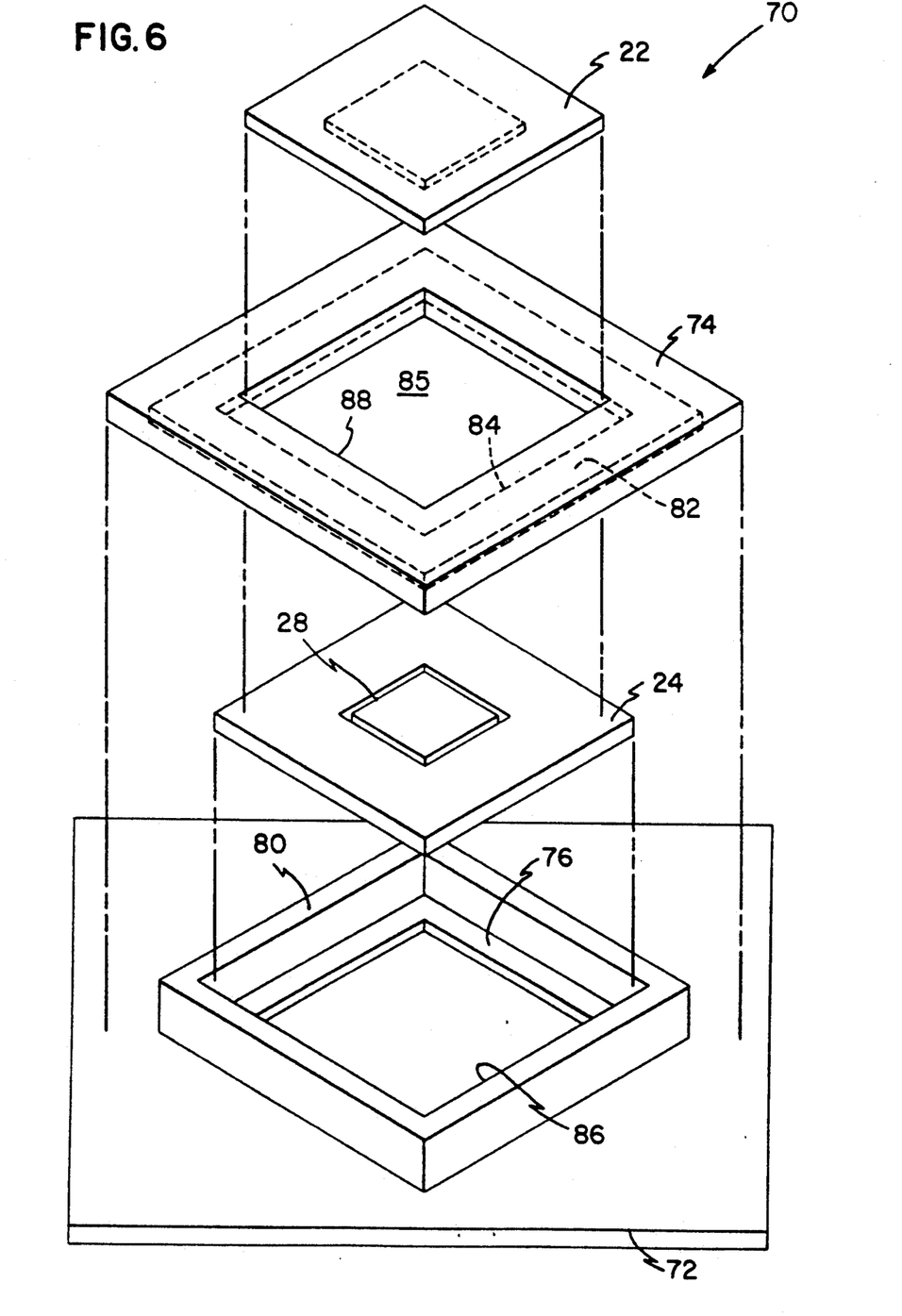
FIG. 6 is an exploded perspective view of an alternative embodiment of the present invention.
Figure 7A:
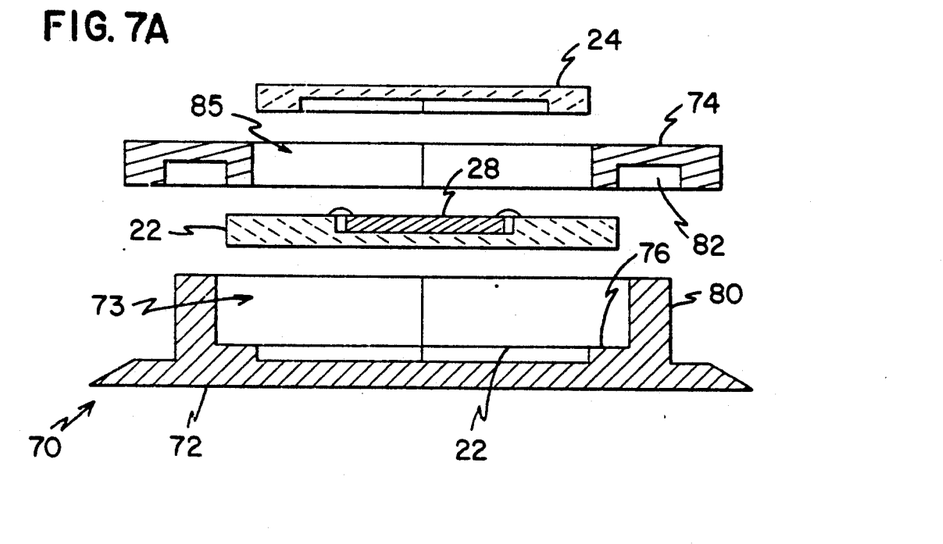
FIGS. 7A, 7B and 7C are cross-sectional views of the alternative embodiment of the present invention shown in FIG. 6.
Figure 7B:
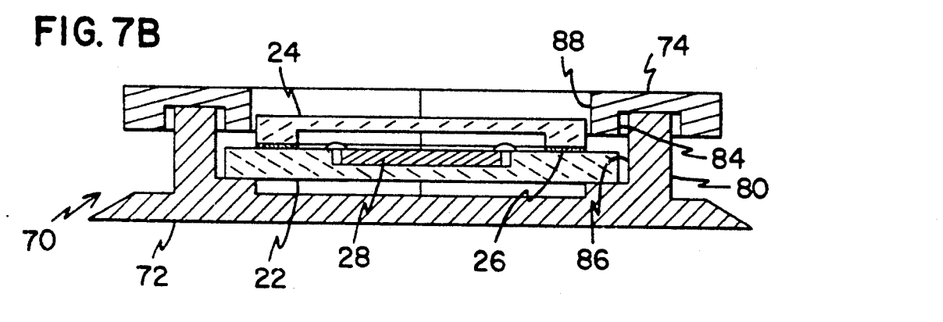

In an alternative embodiment of the invention, a self-aligning sealing fixture 70 is shown in FIG. 6 and FIG. 7. In this embodiment, the IC package components 20, chip carrier 22 and lid 24, are assembled when the sealing fixture is in a horizontal position, FIG. 7A and FIG. 7B. The entire assembly is then inclined to align the components 20 when sealed.

The self-aligning sealing fixture 70 includes a sealing boat 72, an alignment cap 74, and a means for inclining the fixture at the angle e after assembled in the horizontal position. The sealing boat 72 includes a rectangular chamber 73 rotated 45° with respect to a longitudinal axis of the sealing boat 72. As shown in FIG. 7A, a chip carrier 22 is positioned into chamber 73 and upon base 76 of sealing boat 72 so that the cavity in which the IC 28 is mounted is facing upward in chamber 73. The alignment cap 74 is then positioned on sealing boat 72. A set of tabs 80 on the sealing boat 72 mate with tab openings 82 of the alignment cap 74 so that a rectangular window 85 in the alignment cap 74 is rotated 45° with respect to the longitudinal axis of the sealing boat 72. The package lid 24 is then inserted into the window 85 of alignment cap 74 and upon the chip carrier 22. Sealing material 26 is applied between the chip carrier 22 and lid 24.

Figure 7C:
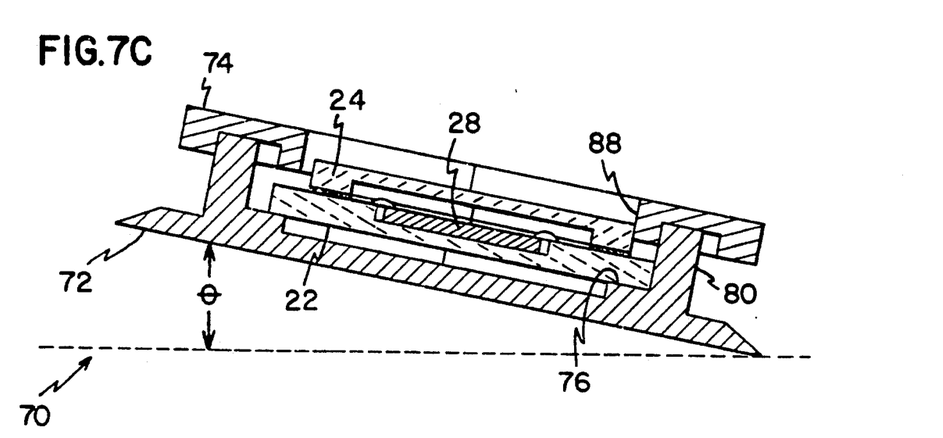

When the sealing fixture 70 is assembled, as shown in FIG. 7B, the entire sealing fixture is inclined as shown in FIG. 7C at an angle $\theta$, approximately 10° to 30°. In the inclined position, the chip carrier 22 aligns itself along a downhill edge 86 of the sealing boat 72. The lid 24 aligns itself on the chip carrier 22 via alignment along the downhill edge 88 of alignment cap 74 and the alignment cap 74 being aligned by contact of surface 84 in tab opening 82 of the alignment cap 74 with the downhill edge 86 of sealing boat 72. The downhill edges, like the downhill edges of the previous embodiment described above, control the lid 24 position (X, Y plane and theta rotation) relative to the chip carrier 22.

Sealing fixture 70 has the advantage of, in addition to being used as a sealing fixture, also being used as a process boat for preceding assembly operations, i.e. die attach and wire bonding. Although this is a two part fixture, the alignment cap 74 is alone responsible for all package component alignment, thus the tolerances of the sealing boat 72 are insignificant.

Although the present invention has been described above in a preferred form, those skilled in the art will readily appreciate that various modifications may be made to it without departing from the spirit and scope of the invention, as bounded by the claims of the application itself.

We claim:

1. An apparatus for use in sealing integrated circuit packages, comprising:
   a body having at least one alignment cavity located within said body for receiving components of the integrated circuit packages;
   alignment cap means for aligning at least one of the components of the integrated circuit packages in the at least one alignment cavity;
   inclining means for inclining said body at an angle between 10° and 30° relative to a horizontal reference plane to align said components in said at least one alignment cavity;
   wherein at least one alignment cavity comprises a rectangular alignment cavity rotated at a 45° angle relative to a length-wise axis of said body; and
   wherein the rectangular alignment cavity includes:
   a first chamber having a base for receiving a package lid, said first chamber having walls extending from said base for aligning said package lid within the alignment cap means within the rectangular alignment cavity; and
   a second chamber extending from said first chamber for receiving a chip carrier, said second chamber having walls extending from said walls of said first chamber for aligning said chip carrier within the rectangular alignment cavity relative to said package lid.

2. An apparatus according to claim 1 wherein the body comprises a rectangular body.

3. An apparatus according to claim 1 wherein the body is comprised of a dimensionally stable material at or above a temperature required for sealing components of integrated circuit packages.

4. An apparatus according to claim 1 wherein said body further includes a plurality of mass removed portions determined as a function of the temperature required for performing the sealing operation.

5. A method for sealing an integrated circuit package comprising the steps of:
   providing a chip carrier having an IC mounted therein, a package lid, and adhesive means for sealing said chip carrier and said package lid;
   providing an inclined sealing fixture, the inclined sealing fixture having a body with a length-wise axis therein, an alignment cap having a window therethrough, at least one alignment cavity being located within the body rotated at a 45° angle relative to the length-wise axis of the body, and inclining means for inclining said body at an angle between 10° and 30° relative to a horizontal reference plane;
   placing the alignment cap over the alignment cavity;
   placing adhesive means on said package lid or said chip carrier;
   positioning said package lid within the alignment cap window in a first chamber of said alignment cavity, said alignment cap window defining walls for aligning said package lid in said alignment cavity;
   positioning said chip carrier in a second chamber of said alignment cavity adjacent said package lid such that said adhesive means exists between said lid and chip carrier, said second chamber extending from said first chamber and having walls for alignment said chip carrier relative to said package lid; and heating the inclined sealing fixture with said chip carrier, said package lid, and said adhesive means thereon to seal said IC package.

6. The method according to claim 5, further comprising the step of removing a plurality of mass portions from the inclined sealing fixture body, the number of mass portions removed determined as a function of the temperature required for sealing the integrated circuit package.

7. A method for sealing an integrated circuit package, comprising the steps of:

placing a chip carrier within a rectangular chamber on a base of a first body portion, said rectangular chamber rotated 45° relative to a lengthwise axis of said first body portion, said chamber defined by walls extending from said base;

positioning a second alignment cap body portion, having slots for mating with said walls of said first body portion, upon said walls of said first body portion, said alignment cap having a rectangular window therethrough, said rectangular window rotated 45° relative to said lengthwise axis when said alignment cap is mated with said first body portion;

inserting a lid partially through said window and positioning said lid upon said chip carrier, a sealing material being placed between said lid and said chip carrier;

inclining said first body portion and alignment cap between 10° and 30° relative to a horizontal plane; and heating said inclined first body portion and alignment cap along with said chip carrier, lid and sealing material to seal said integrated circuit package.

8. An apparatus for use in sealing integrated circuit packages, comprising:

a body having at least one alignment cavity located within said body for receiving components of the integrated circuit packages;

inclining means for inclining said body at an angle between 10° and 30° relative to a horizontal reference plane to align said components in said at least one alignment cavity;

wherein at least one alignment cavity comprises a rectangular alignment cavity rotated at a 45° angle relative to a length-wise axis of said body; and wherein said body comprises:

a first body portion including said rectangular alignment cavity, said rectangular cavity defined by a base for receiving a chip carrier and walls extending from said base for aligning said chip carrier within said cavity when said body is inclined; and a second alignment cap body portion having means for mating with said walls of said first body portion and having a window therethrough for inserting and positioning a package lid upon said chip carrier, said lid being positioned partially within said cavity and partially within said window, said window defining walls of said alignment cap for aligning said lid when said body is inclined, said mating means for aligning said alignment cap relative to said first body portion.

* * * * *

UNITED STATES PATENT AND TRADEMARK OFFICE
CERTIFICATE OF CORRECTION

PATENT NO. : 5,332,463

DATED : July 26, 1994

INVENTOR(S) : Delvin D. Eberlein et al.

It is certified that error appears in the above-indentified patent and that said Letters Patent is hereby corrected as shown below:

Column 5, Line 30, please delete "the angle e after" and insert --the angle θ after-- therefore.

Signed and Sealed this

Seventh Day of November, 199

Attest:

BRUCE LEHMAN

Attesting Officer     Commissioner of Patents and Trademarks